United States Patent
Shishiguchi et al.

[11] Patent Number: 5,951,774
[45] Date of Patent: Sep. 14, 1999

[54] COLD-WALL OPERATED VAPOR-PHASE GROWTH SYSTEM

[75] Inventors: Seiichi Shishiguchi; Tohru Aoyama; Tatsuya Suzuki, all of Tokyo, Japan

[73] Assignee: NEC Corporation, Tokyo, Japan

[21] Appl. No.: 08/967,058

[22] Filed: Nov. 10, 1997

Related U.S. Application Data

[63] Continuation of application No. 08/593,687, Jan. 29, 1996.

[30] Foreign Application Priority Data

Jan. 27, 1995 [JP] Japan .................. 7-031526

[51] Int. Cl.$^6$ .................................... C23C 16/00
[52] U.S. Cl. .................. 118/725; 118/728; 118/500
[58] Field of Search .................. 118/725, 728, 118/729, 730, 500

[56] References Cited

U.S. PATENT DOCUMENTS

| | | | |
|---|---|---|---|
| 3,372,671 | 3/1968 | Chu | 118/725 |
| 3,436,255 | 4/1969 | Harris et al. | 118/725 |
| 3,539,759 | 11/1970 | Spiro et al. | 118/725 |
| 4,113,547 | 9/1978 | Katz et al. | 156/612 |
| 4,424,096 | 1/1984 | Kumagai | 156/643 |
| 4,661,199 | 4/1987 | Looney | 156/612 |
| 4,710,428 | 12/1987 | Tamamizu | 428/408 |
| 4,817,558 | 4/1989 | Itoh | 118/725 |
| 4,897,171 | 1/1990 | Ohmi | 204/298.15 |
| 5,094,885 | 3/1992 | Selbrede | 427/248.1 |
| 5,119,540 | 6/1992 | Kong et al. | 29/25.01 |
| 5,119,541 | 6/1992 | Ohmi et al. | 29/25.02 |
| 5,288,364 | 2/1994 | Burt | 156/601 |
| 5,292,554 | 3/1994 | Sinha | 427/251 |
| 5,304,248 | 4/1994 | Cheng | 118/728 |
| 5,445,676 | 8/1995 | Takagi | 118/719 |
| 5,474,612 | 12/1995 | Sato | 118/725 |
| 5,480,489 | 1/1996 | Hasegawa | 118/725 |
| 5,522,937 | 6/1996 | Chew | 118/728 |
| 5,551,982 | 9/1996 | Anderson | 118/715 |
| 5,561,612 | 10/1996 | Thakur | 364/557 |
| 5,580,388 | 12/1996 | Moore | 118/728 |
| 5,871,588 | 2/1999 | Moslehi et al. | 118/730 |

FOREIGN PATENT DOCUMENTS

| | | | |
|---|---|---|---|
| 3837584 A1 | 5/1989 | Germany | 118/728 |
| 59-55441 | 3/1984 | Japan . | |
| 60-263428 | 12/1985 | Japan | 118/728 |
| 61-4223 | 1/1986 | Japan . | |
| 62-99474 | 5/1987 | Japan . | |
| 64-25985 | 1/1989 | Japan | 118/728 |
| 5-152210 | 6/1993 | Japan . | |

*Primary Examiner*—Bruce Breneman
*Assistant Examiner*—Jeffrie R Lund
*Attorney, Agent, or Firm*—Sughrue, Mion, Zinn Macpeak & Seas, PLLC

[57] ABSTRACT

A vapor-phase growth system able to avoid fluctuation of the heating performance of a heater during repeated growth processes is provided. This system includes a reactor, a substrate holder for holding a substrate, and a heater for heating the substrate held by the holder. The holder and the heater are placed in an inner space of the reactor. The holder and the substrate held by the holder divide an inner space of the reactor to thereby form a growth chamber in which a thin film is grown during a growth process and a heater chamber in which the heater is placed. The holder has a supporting member on which the substrate is placed. At least a part of the member is made of the same material as that of the thin film. The supporting member is made of a SOI substrate.

14 Claims, 10 Drawing Sheets

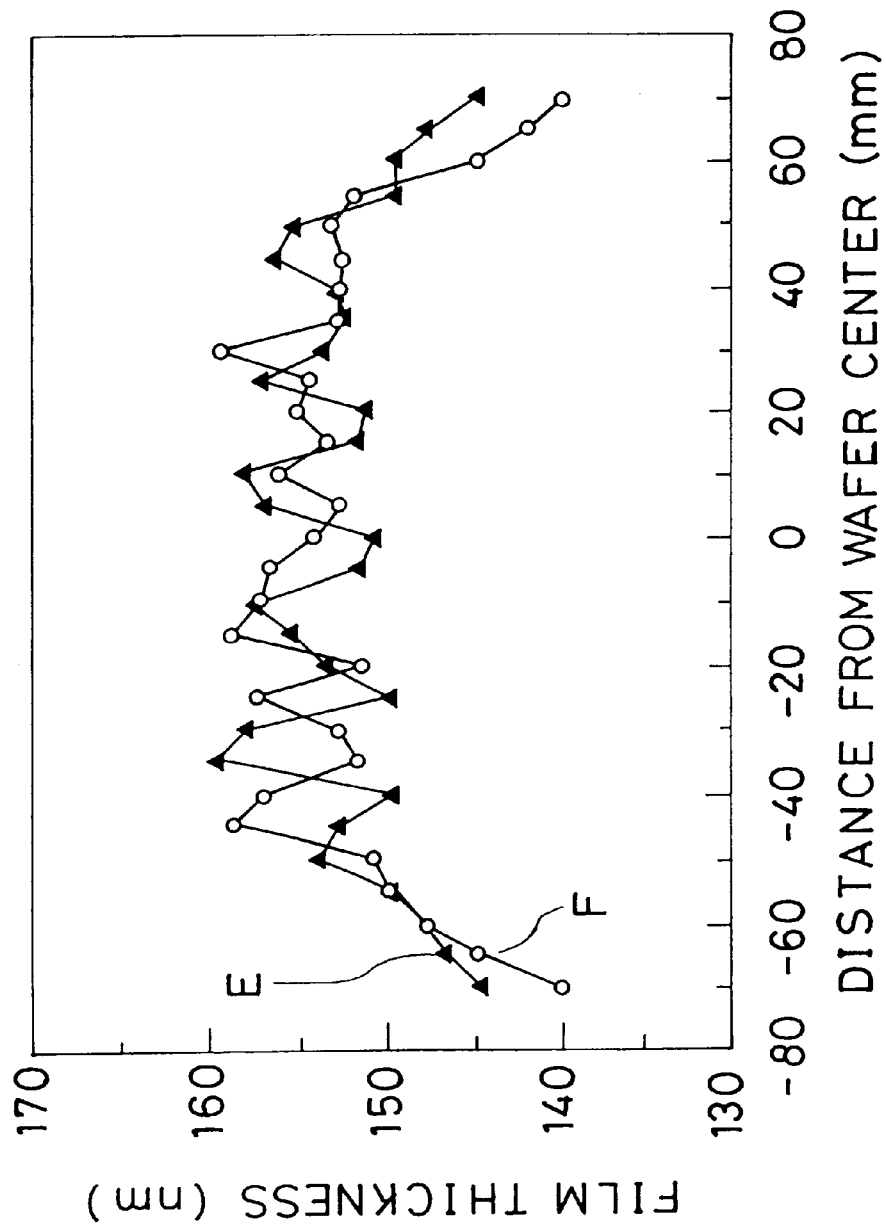

COLD-WALL OPERATED VAPOR-PHASE GROWTH SYSTEM

This is a continuation of application Ser. No. 08/593,687 filed Jan. 29, 1996.

BACKGROUND OF THE INVENTION

1. Field of the Invention

The present invention relates to a vapor-phase growth system and more particularly, to a cold-wall operated vapor-phase growth system having a reactor in which the inner space is divided into a growth chamber and a heater chamber by a holder and a substrate or wafer held by the holder in the space.

2. Description of the Prior Art

A vapor-phase growth system or equipment with a heating mechanism is usually used for thin-film growth processes such as a Low-Pressure Chemical Vapor Deposition (LPCVD) and a Molecular-Beam Epitaxy (MBE), or a process of forming a Hemi-Spherical Grained Silicon (HSG-Si) layer.

The conventional vapor-phase growth system has a reactor in which a thin film is grown on a substrate or J wafer. If the wall temperature of the reactor becomes high, in other words, the entire chamber becomes hot, during a growth process, it is said that the system is operated "hot-wall". If the wall temperature of the chamber does not become high, in other words, only the wafer becomes hot, during a growth process, it is said that the system is operated "cold-wall".

Also, when the reactor is designed for placing only one wafer in the reactor, it is called a "single-wafer" reactor. When the reactor is designed for placing a plurality of wafers in the reactor at a time, it is called a "batch" reactor.

The characteristics and uniformity of a thin film grown on the wafer is affected by cleanliness in the inner space of the reactor and uniformity of the wafer temperature. Considering this fact, various configurations and materials have been researched and developed in order to obtain a suitable support for the wafer.

A conventional cold-wall operated vapor-phase growth system is illustrated in FIGS. 1 to 3. As shown in FIG. 1, this system contains a water-cooled reactor 812 made of stainless steel, a cylindrical wafer holder 804 fixed in the reactor 812, a heater 806 provided in the reactor 812, a gas nozzle 816 fixed to the reactor 812 and communicated with a reaction gas source, and two turbo molecular pumps 808 and 809 connected to the reactor 812.

A top part 803 of the holder 804 is formed by a level plate, which is called a susceptor. The susceptor 803 supports a semiconductor substrate or wafer 801 on which a thin film or films are grown.

The heater 806, which is placed under the susceptor 803, raises the temperature of the wafer 801. The gas nozzle 816 supplies the reaction gas to the reactor 812. The turbo molecular pumps 808 and 809 pump out the air existing in the reactor 812 to thereby reduce its pressure.

The inner space of the reactor 812 is divided into two parts by the cylindrical wafer holder 804 and the wafer 801, one of which serves as a growth chamber 802 in which a thin film or films are grown on the wafer 801 using the supplied reaction gas in a vapor phase, and the other serves as a heater chamber 807 including the heater 806 therein.

The susceptor 803 is made of a circular-ringed outer part 803a and a circular-ringed inner part 803b, which is a double structure. The outer and inner parts 803a and 803b are made of quartz, for the following reasons:

(a) Since high purity quartz can be produced, the inner space of the reactor 812, i.e., the growth and heater chambers 802 and 807, can be kept clean.

(b) Quartz has a sufficiently high temperature resistance against the wafer temperature during the film growth process.

(c) Quartz has a sufficiently low heat-absorption rate of radiated heat from the heater 806.

The double structure functions to absorb deformation of the susceptor 803 due to thermal expansion with a clearance between the outer and inner parts 803a and 803b.

To be seen from FIGS. 2 and 3, the inner part 803b has an approximately circular window at its center to facilitate the transmission of the radiated heat from the underlying heater 806 to the wafer 801. The inner diameter of the inner part 803b is slightly smaller than the diameter of the wafer 801. The wafer 801 is placed onto the inner part 803b to be approximately concentric therewith. When the wafer 801 is placed onto the inner part 803b, the outer peripheral area of the wafer 801 contacts the inner peripheral area of the inner part 803b, as clearly shown in FIG. 3. The contact areas of the wafer 801 and the inner part 803b are very narrow.

The outer diameter of the inner part 803b is considerably larger than the diameter of the wafer 801. Therefore, almost the entire surface of the wafer 801 is exposed to the growth chamber 802.

The inner part 803b has a flat 803c engaged with the orientation flat 801c of the wafer 801.

As shown in FIG. 3, the outer part 803a is thicker than the inner part 803b, and has a small lateral protrusion at its inner side. The inner part 803b is placed on the protrusion to be engaged with the outer part 803a, thereby forming the double-structured susceptor 803. Almost all of the surface of the outer part 803a is exposed to the growth chamber 802.

The inner diameter of the outer part 803a is approximately equal to the outer diameter of the inner part 803b.

Since the contact area of the wafer 801 is heated through the inner part 803b of the susceptor 803 by the heater 806, the amount of the radiated heat tends to decrease compared with the case of the remainder of the wafer 801. Accordingly, if the susceptor 803 absorbs the radiated heat at a high rate, there is a problem that the temperature of the wafer 801 decreases in its contact area with the part 803b occurs. However, in the conventional system of FIGS. 1 to 3, the temperature decrease of the wafer 801 can be ignored, because the susceptor 803 is made of quartz having a sufficiently low heat-absorption rate.

As described above, with the conventional vapor-phase growth system, the double-structured susceptor 803 supports the wafer 801 and as a result, high temperature uniformity within the entire wafer 801 can be obtained while keeping the cleanliness high in the inner space of the reactor 812. However, the following problem occurs.

When a silicon thin film is grown on the wafer 801 in the conventional system, polycrystalline silicon (i.e., polysilicon) tends to be deposited on the inner part 803b of the susceptor 803 in the vicinity of the wafer 801, because the elevated temperature in the vicinity is approximately equal to that of the wafer 801. This deposited polysilicon becomes thicker with each repetition of the growth process, and finally, it is separated from the inner part 803b. The separated, deposited polysilicon not only becomes a source of particles but also causes the following serious problem.

Specifically, as already described above, the inner space of the reactor 812 is divided into the growth chamber 802 and the heater chamber 807 by the wafer holder 804 and the wafer 801 held by the holder 804, and both the chambers 802 and 807 are separately pumped out by the turbo molecular pumps 808 and 809. Therefore, the reaction gas supplied to the growth chamber through the nozzle 816 does not enter the heater chamber 807.

However, if the deposited polysilicon film is separated from the inner part 803*b* of the susceptor 803, the particles generated from the polysilicon film are deposited between the wafer 801 and the underlying inner part 803*b*, resulting in a gap therebetween. Then, the reaction gas is able to enter the heater chamber 807 through the gap. Consequently, unwanted polysilicon tends to be deposited on the heater 806 in the heater chamber 807, thereby changing the heating performance or characteristic of the heater 806.

For example, when the heater 806 is made of a resistive carbon and a quartz film formed to cover the carbon, polysilicon is deposited onto the quartz film in great volume. Since polysilicon has a larger heat absorption rate than quartz, the amount of heat applied to the wafer 801 tends to decrease, which leads to temperature lowering of the wafer 801.

The polysilicon film deposited onto the heater 806 becomes thicker with each repetition of the growth process, thereby increasing the amount of the absorbed heat. As a result, the practical temperature of the wafer 801 decreases even if the same power is supplied to the heater 806. This results in a problem that an obtainable thickness of the grown film fluctuates during the repeated growth processes.

Additionally, when a corrosive gas such as chlorine (Cl) gas is used as the reaction gas, the lifetime of the heater 806 itself shortens due to the presence of the reaction gas.

SUMMARY OF THE INVENTION

Accordingly, an object of the present invention is to provide a vapor-phase growth system that avoids fluctuation of the heating performance of a heater during repeated growth processes.

Another object of the present invention is to provide a vapor-phase growth system that avoids separation of a deposited material on a susceptor.

These objects together with others not specifically mentioned will become clear to those skilled in the art from the following description.

A vapor-phase growth system according to the present invention includes a reactor, a substrate holder for holding a substrate, and a heater for heating the substrate held by the holder. The holder and the heater are placed in an inner space of the reactor. The holder and the substrate held by the holder divide an inner space of the reactor to thereby form a growth chamber in which a thin film is grown during a growth process and a heater chamber in which the heater is placed.

With the system according to the invention, the substrate holder has a supporting member for supporting the substrate thereon, and at least part of the member is made of the same material as that of a thin film so that an unwanted film is formed on the respective part of the member during the growth process. Therefore, when an unwanted film is formed on the supporting member of the holder during the growth process, the unwanted film is not separated from the member because the unwanted film is the same material as the grown film. Thus, no particles are generated due to the unwanted film.

Also, since the unwanted film is not separated from the supporting member, fluctuation of the heating performance of the heater can be avoided even if the growth process is repeated. This leads to improved thickness uniformity of the grown film.

In a preferred embodiment of the invention, at least part of the supporting member is made of single-crystal or polycrystalline silicon (Si). In this case, the above advantage can be obtained for a silicon film which is popularly grown in this system and therefore, this system is very effective.

In another preferred embodiment of the invention, part of the supporting member is made of the same material as that of the thin film, and the remainder of the member is made of a material having a lower heat absorption rate than that of the thin film. Therefore, an advantage is that the temperature of the substrate is difficult to decrease.

In this case, the supporting member is preferably made of a Silicon-On-Insulator (SOI) substrate. The SOI substrate is preferably made of a bonded SOI substrate that is produced by bonding a single-crystal silicon layer to a quartz plate.

In a further preferred embodiment of the invention, penetrating holes are formed in a contact area of the supporting member with the substrate. In this case, the contact area can be reduced compared with the case of no penetrating holes. Also, because heat generated from the heater is effectively transmitted to the substrate through the penetrating holes, the temperature of the wafer does not easily decrease in the contact area.

BRIEF DESCRIPTION OF THE DRAWINGS

In order that the invention may be readily carried into effect, it will now be described with reference to the accompanying drawings.

FIG. 14 is a graph showing a relationship between the distance from the wafer center and the film thickness in the vapor-phase growth system of FIG. 12.

DETAILED DESCRIPTION OF THE PREFERRED EMBODIMENTS

Preferred embodiments of the present invention will be described in detail below while referring to FIGS. 4 to 14.

First Embodiment

Figure 4:
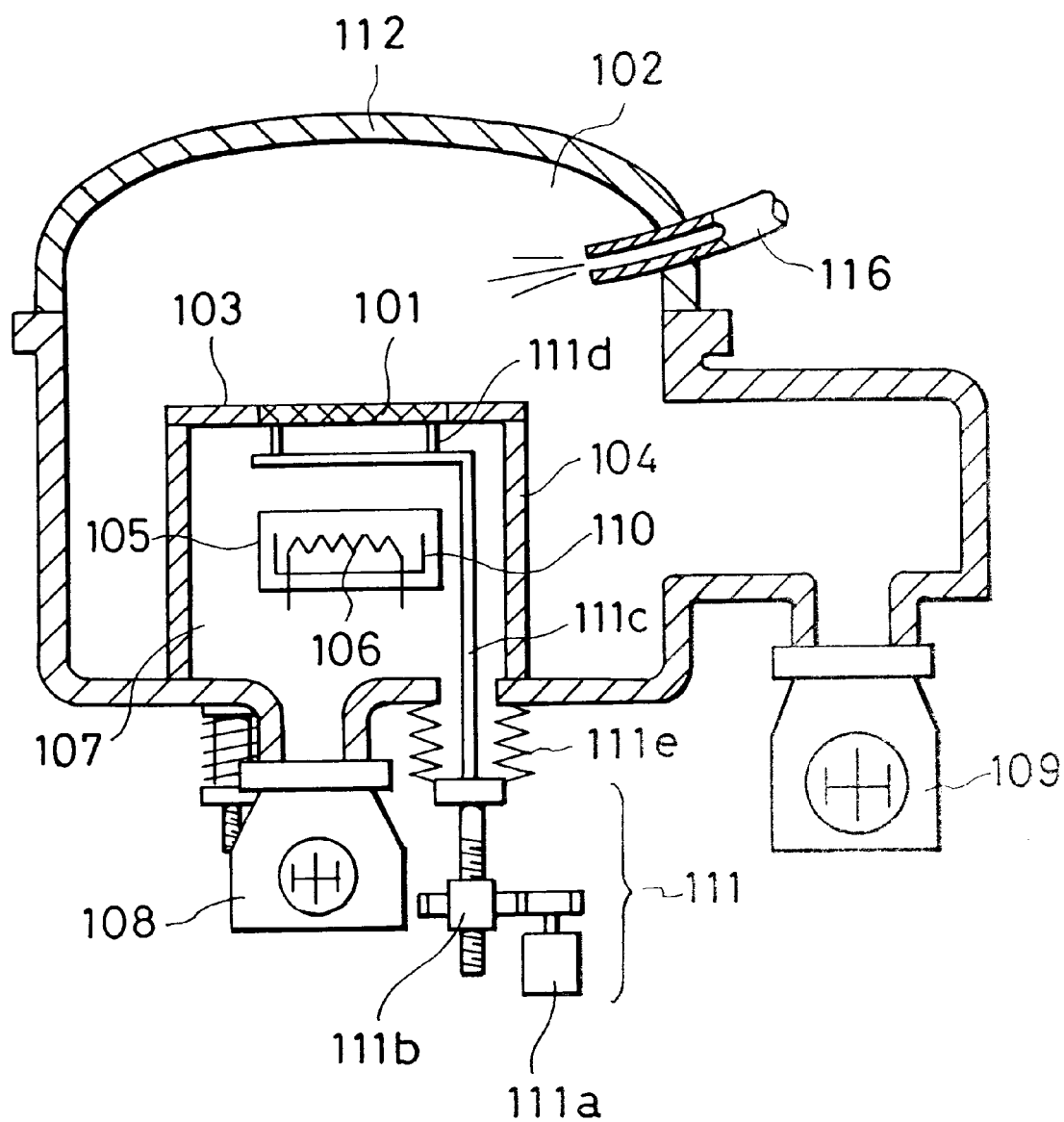
FIG. 4 is a schematic cross-section of a vapor-phase growth system according to a first embodiment of the invention.

As shown in FIG. 4, a vapor-phase growth system according to a first embodiment of the invention has a water-cooled reactor 112 made of stainless steel. The walls of the reactor 112 have vacancies through which cooling water flows to circulate therein. Therefore, this system is operated cold-wall.

A cylindrical wafer holder 104 is fixed in the reactor 112. A top part 103 of the holder 104, i.e., a susceptor, is formed by a level plate. The susceptor 103 horizontally supports a semiconductor substrate or wafer 101 on which a thin film or films are grown. A heater unit 105 is provided in the cylindrical holder 104 under the susceptor 103. The unit 105 includes a resistive carbon 106 and a heat reflection plate 110. The carbon 106 generates heat to raise the temperature of the wafer 101. The reflection plate 110 is placed near the carbon 106 and reflects the heat toward the wafer 101, thereby improving the heating efficiency. A wafer-moving mechanism 111 moves the wafer 101 up and down. This mechanism 111 contains a driving motor 111a placed outside the reactor 112, a rod-moving structure 111b placed outside the reactor 112 and driven by the motor 111a, a supporting rod 111c connected to the rod-moving structure 111b and placed in the reactor 112, four rod-like wafer contacts 111d fixed to the top end of the rod 111c in the reactor 112. A bellows 111e is attached to the wall of the reactor 112 at a position where the rod 111c penetrates the wall for the purpose of keeping the vacuum condition in the reactor 112. The wafer 101 is horizontally held by the contacts 111d and is moved upward and downward.

A gas nozzle 116 is fixed to the reactor 112. This nozzle 116 is communicated with a reaction gas source (not shown). A reaction gas is supplied through the nozzle 116 to the reactor 112.

Two turbo molecular pumps 108 and 109 are connected to the reactor 112 to make a desired vacuum condition in the reactor 112.

As shown in from FIG. 4, the inner space of the reactor 112 is divided into two parts by the cylindrical wafer holder 104 and the wafer 101 held by the susceptor 103. One of the parts serves as a growth chamber 102 in which a thin film or films are grown on the wafer 101 using the supplied reaction gas in a vapor phase, and the other serves as a heater chamber 107 in which the heater unit 105 is contained therein.

The turbo molecular pumps 108 and 109 are connected to the growth chamber 102 and the heater chamber 107, respectively. As a result, the pressures in the chambers 102 and 107 can be reduced to have different vacuum conditions, independently. In this embodiment, the lowest pressures of the both chambers 102 and 107 that can be attained are $10^{-10}$ Torr or less. Since the chambers 102 and 107 are separated, the pressure in the heater chamber 107 can be set lower than that in the growth chamber 102 by two 5 figures or more.

Although not shown, a wafer transporting system and a load-lock chamber are provided outside the reactor 112, both of which have known structures. The wafer transporting system transports the wafer 101 from a wafer storing chamber (not shown) to the load-lock chamber in a vacuum state. The wafer 101 thus transported to the load-lock chamber is introduced into the reactor 112 through the load-lock chamber without breaking the vacuum condition in the reactor 112.

Figure 5:
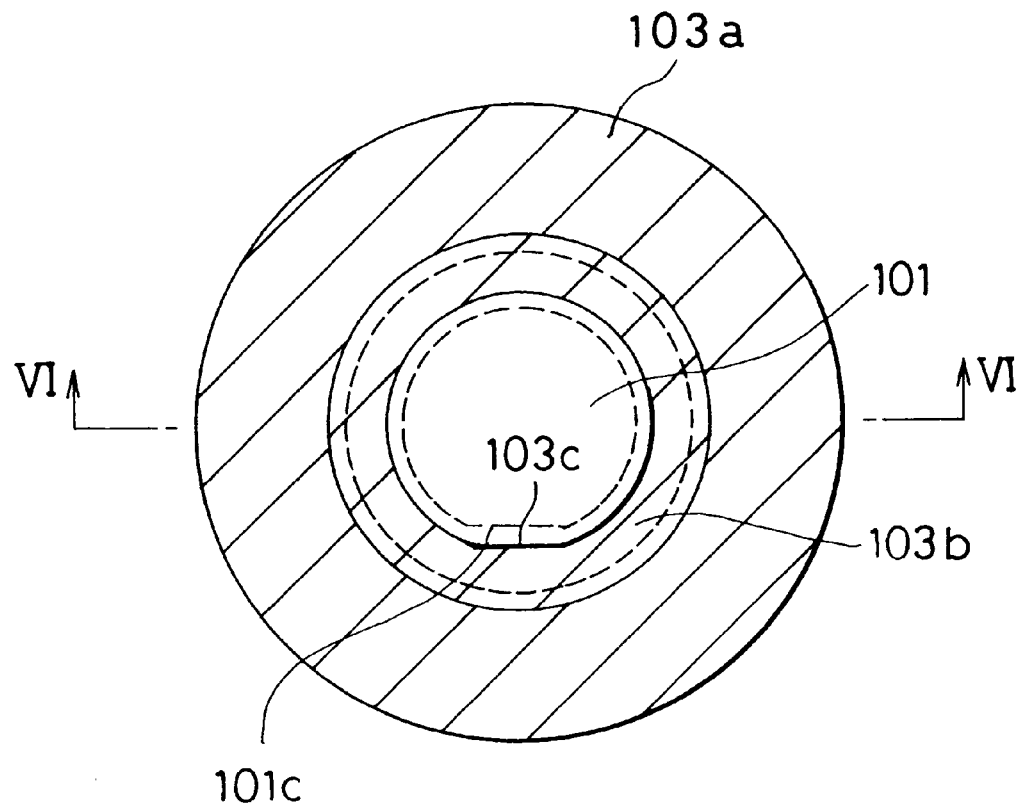
FIG. 5 is a schematic, plan view of the susceptor of the vapor-phase growth system of FIG. 4, in which a semiconductor wafer is placed on the inner part of the susceptor.
Figure 6:
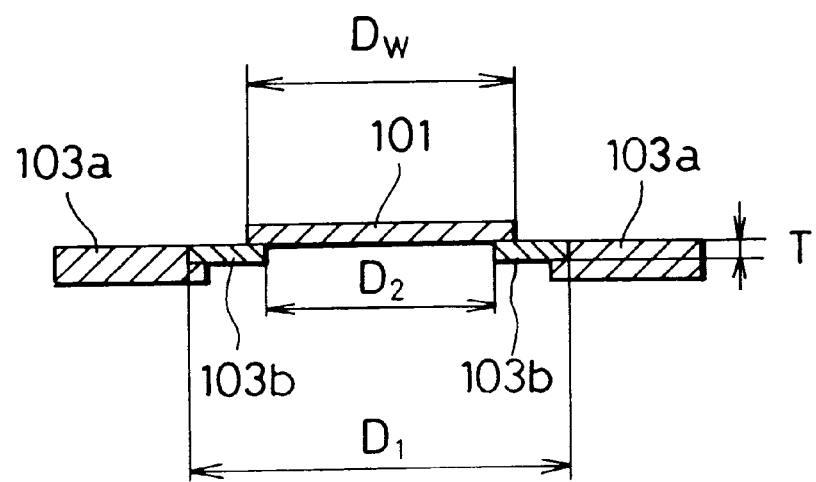
FIG. 6 is a schematic cross section of the susceptor along the line IV—VI in FIG. 5.
Figure 7:
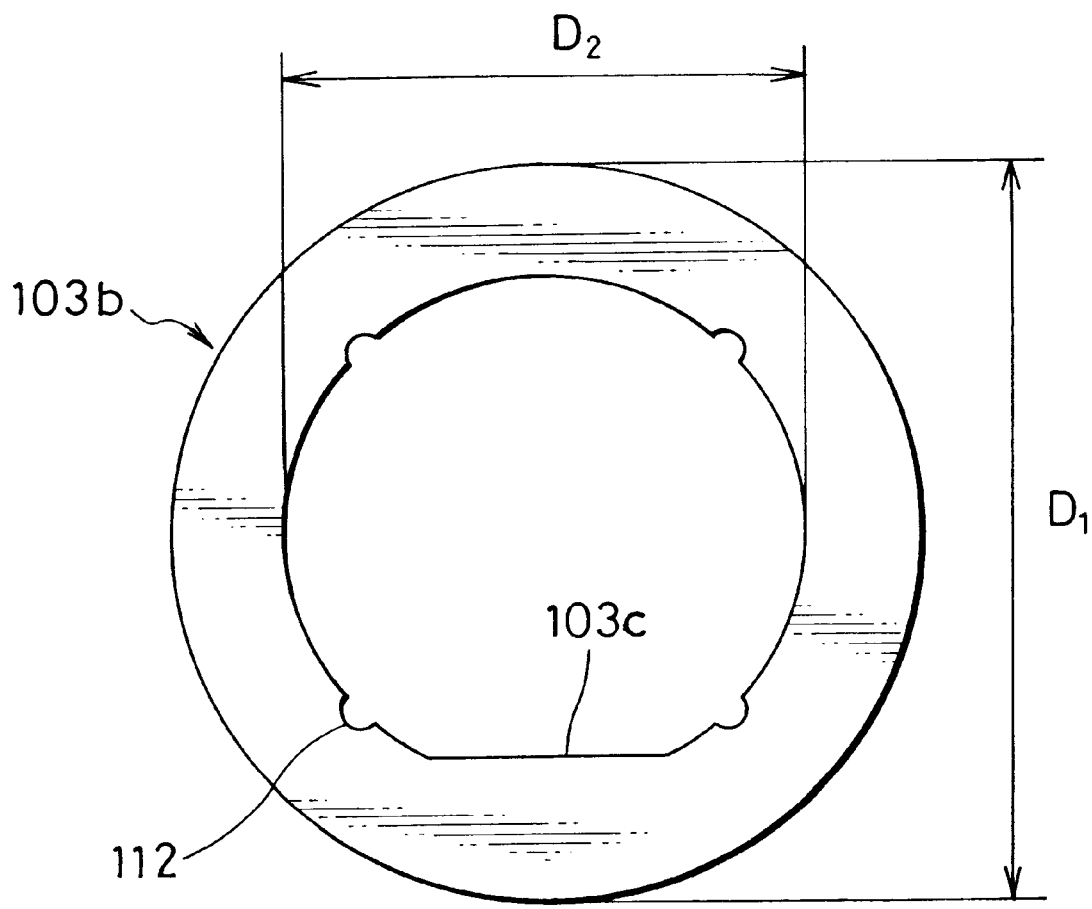
FIG. 7 is a plan view of an inner part of the susceptor used for the vapor-phase growth system of FIG. 4.

As shown in FIGS. 5, 6 and 7, the susceptor 103 is made of a circular-ringed outer part 103a and a circular-ringed inner part 103b, which is a double structure. This structure is adopted to absorb deformation of the susceptor 103 due to thermal expansion with a clearance between the outer and inner parts 103a and 103b.

Figure 1:
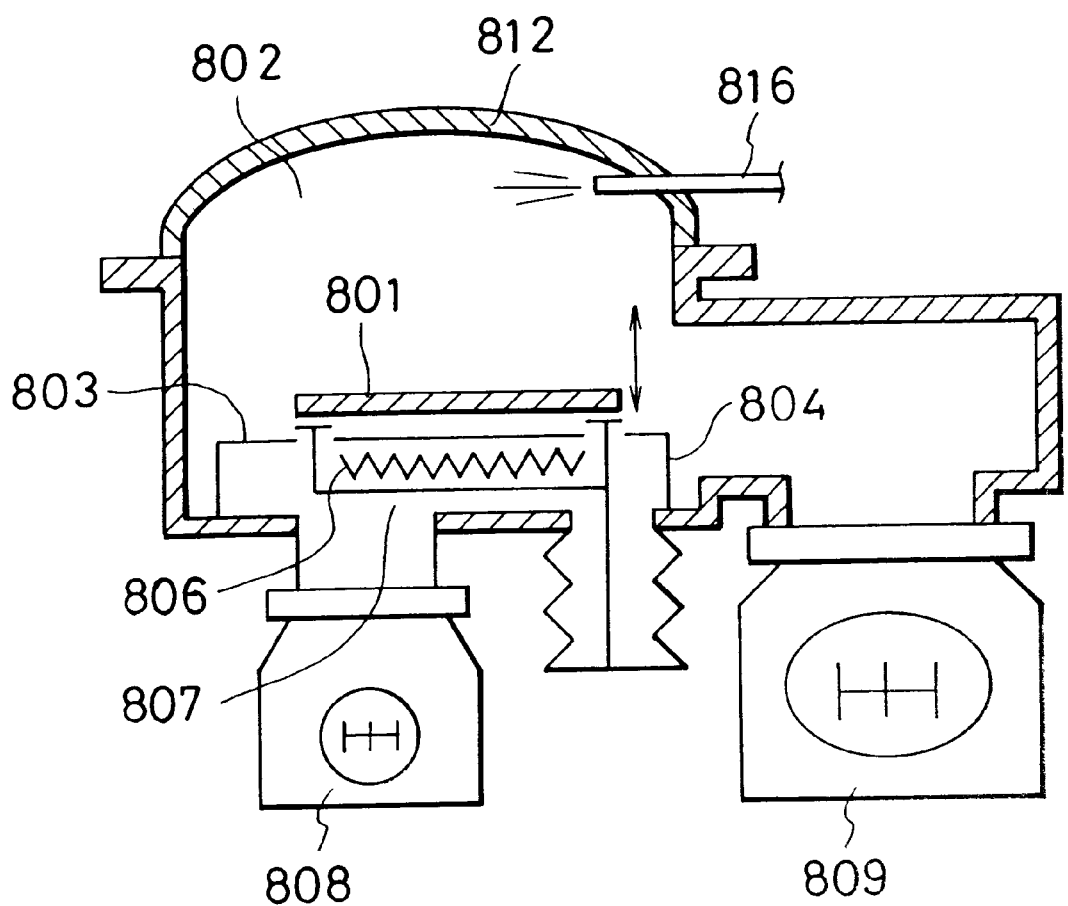
FIG. 1 is a schematic cross-section of a conventional vapor-phase growth system.
Figure 2:
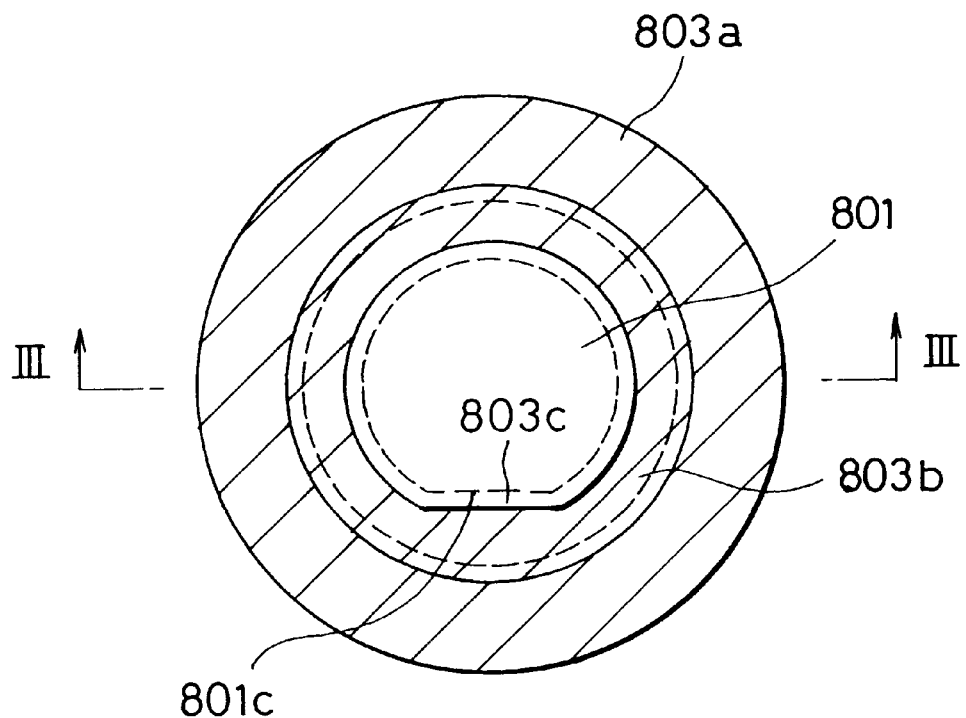
FIG. 2 is a schematic, plan view of the susceptor of the conventional vapor-phase growth system of FIG. 1, in which a semiconductor wafer is placed on the inner part of the susceptor.
Figure 3:
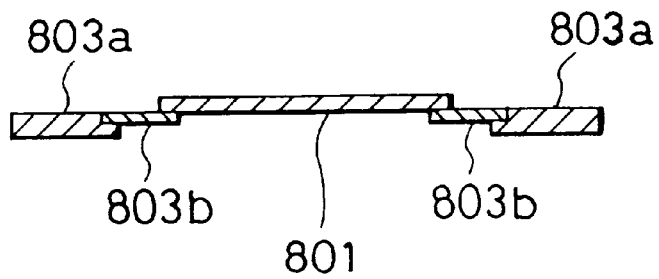
FIG. 3 is a schematic cross section of the susceptor along the line III—III in FIG. 2.

Unlike the conventional vapor-phase growth system of FIG. 1, although the outer part 103a is made of quartz, the inner part 103b is made of single-crystal silicon. The inner part 103b has an approximately circular window at its center to facilitate the transmission of the radiated heat from the underlying heater unit 105 to the wafer 101. The inner diameter $D_2$ of the inner part 103b is slightly smaller than the diameter $D_W$ of the wafer 101. The wafer 101 is placed onto the inner part 103b to be approximately concentric therewith. When the wafer 101 is placed onto the inner part 103b, the outer, lower peripheral area of the wafer 101 is contacted with the inner, upper peripheral area of the inner part 103b, as clearly shown in FIG. 6. The contact areas of the wafer 101 and the inner part 103b are very narrow.

The outer diameter $D_1$ of the inner part 103b is considerably larger than the diameter $D_W$ of the wafer 101. Therefore, almost all the upper surface of the inner part 103b is exposed to the growth chamber 102.

The inner part 103b has a flat 103c and four semicircular holes 112 on its inner edge. The flat 103c is engaged with the orientation flat 101c of the wafer 101.

The holes 112 are vertically penetrated by the four contacts 111d of the wafer-moving mechanism 111.

As shown in FIG. 6, the outer part 103a is thicker than the inner part 103b, and has a small lateral protrusion extending along its inner side. The inner part 103b is placed on the protrusion to be engaged with the outer part 103a, thereby forming the double-structured susceptor 103. Almost all the upper surface of the outer part 103a also is exposed to the growth chamber 102.

The inner diameter of the outer part 103a is approximately equal to the outer diameter of the inner part 103b.

With the vapor-phase growth system according to the first embodiment, the contact area of the wafer 101 is heated through the inner part 103b of the susceptor 103 due to the heat from the heater unit 105, and therefore, the amount of the radiated heat to the contact area tends to be less than that of the remainder of the wafer 101. Accordingly, if the susceptor 103 (i.e., the inner part 103b) absorbs the radiated heat at a high rate, there is a problem that the temperature of the wafer 101 decreases in its contact area. However, in the system of the first embodiment, the temperature decrease of the substrate 101 can be ignored, because single-crystal silicon has a sufficiently low heat-absorption rate that is approximately equal to that of quartz.

Also, when a thin film of single-crystal silicon is epitaxially grown in the system according to the first embodiment, the wafer holder 104 has a supporting surface (i.e., the contact area) on which the wafer 101 is placed, and at least a part of the surface is made of single-crystal silicon which is the same material as that of the thin film to be grown during a growth process. Therefore, an unwanted polysilicon film formed on the supporting surface of the holder 104 during the growth process is not separated from the surface. This means that no particles are generated due to the unwanted film.

Since the unwanted polysilicon film is not separated from the supporting surface, fluctuation of the heating performance of the heater unit 105 can be avoided even if the growth process is repeated. This leads to improved thickness uniformity of the grown silicon film.

For the outer part 103a, the highest temperature of the part 103a is considerably lower than that of the inner part 103b. As a result, no polysilicon film is grown on the outer part 103a.

In the vapor-phase growth system according to the first embodiment, to realize a better contact of the inner part 103b with the wafer 101, the part 103b is made of single-crystal silicon having a small surface roughness. However, the part 103b may be made of polysilicon if a flat supporting surface (i.e., contact area) can be obtained.

The shape of the inner part 103b is dependent on the shape of the wafer 101. Here, since the wafer 101 has the orientation flat 101c, the part 103b has the flat 103c corresponding to the flat 101c. When the wafer 101 has an orientation notch instead of the orientation flat 101c, the part 103b has a circular shape with no flat 103c.

For example, for a silicon wafer with a diameter $D_W$ of 150 mm and an orientation flat, the inner part 103b of the susceptor 103 has an outer diameter $D_1$ of 200 mm, an inner diameter $D_2$ of 135 mm, and a thickness T of 4 mm.

Figure 8:
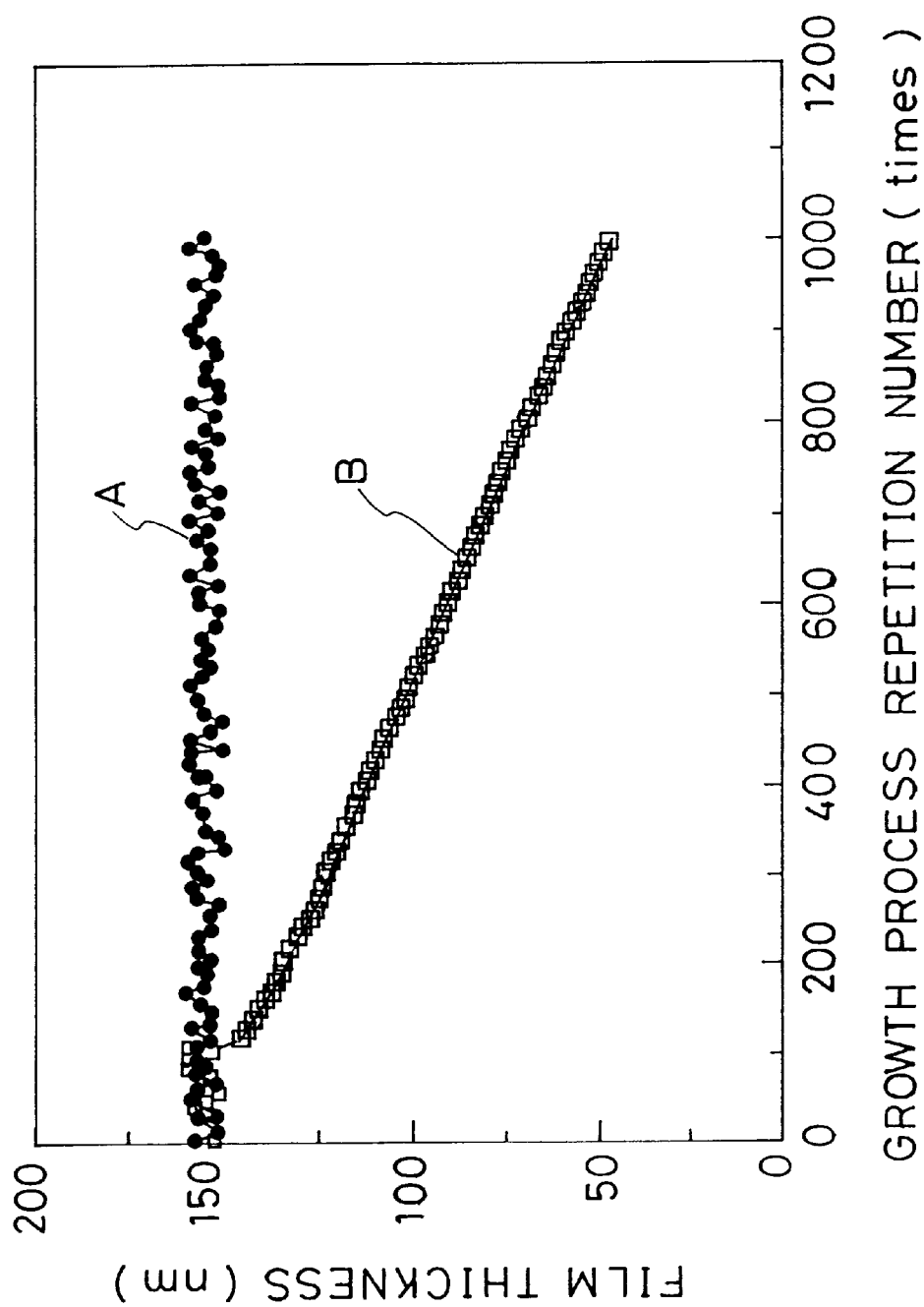
FIG. 8 is a graph showing a relationship between the growth process repetition number and film thickness in the vapor-phase growth system of FIG. 4.

FIG. 8 shows the thickness change of the single-crystal epitaxial film due to the number of repetitions of the growth processes, in which the plot A corresponds to the first embodiment and the plot B corresponds to the conventional one shown in FIG. 1. FIG. 8 was obtained through the inventor's tests performed under the following conditions.

A single-crystal silicon wafer was introduced into the growth chamber 102. Then, the temperature of this wafer was raised to 650° C., and a $Si_2H_6$ gas as the reaction gas was supplied to the chamber 102 at ten (10) Standard Cubic Centimeters per Minutes (SCCM) for fifteen (15) minutes to epitaxially grow a single-crystal silicon film on the wafer.

As shown in FIG. 8 no change in film thickness was found even after this growth process was repeated one thousand (1000) times in the system according to the first embodiment. Also, it is seen that the film thickness started to decrease gradually when this growth process was repeated approximately one hundred (100) times in the conventional system.

Additionally, the inventor performed temperature fluctuation tests on the surface of the silicon wafer using a pyrometer. As a result, no temperature fluctuation was observed for the system according to the first embodiment. However, for the conventional system of FIG. 1, a temperature fluctuation of the wafer surface was observed when the growth process was repeated 100 times.

After the process was repeated 1000 times, the reactor was opened and the interior of the heater chamber was observed. As a result, it was found that a large amount of polysilicon was deposited on the susceptor and the heater in the conventional system of FIG. 1. On the other hand, no polysilicon was deposited on the susceptor and in the heater chamber in the system according to the first embodiment.

The cause of the polysilicon deposition can be explained in the following manner:

In the conventional system, after the growth process was repeated about 100 times, the unwanted polysilicon film deposited on the susceptor is separated therefrom and then, a gap was produced between the susceptor and the wafer due to the particles generated from the separated polysilicon film. The reaction gas in the growth chamber entered the heater chamber through the gap. Thus, a large amount of the polysilicon film was deposited in the heater chamber.

The polysilicon film deposited in the heater chamber absorbed the heat radiated from the heater and as a result, the heating performance or characteristic of the heater was changed even if the temperature setting was not changed. This leads to fluctuation of the polysilicon film thickness.

Second Embodiment

Figure 9:
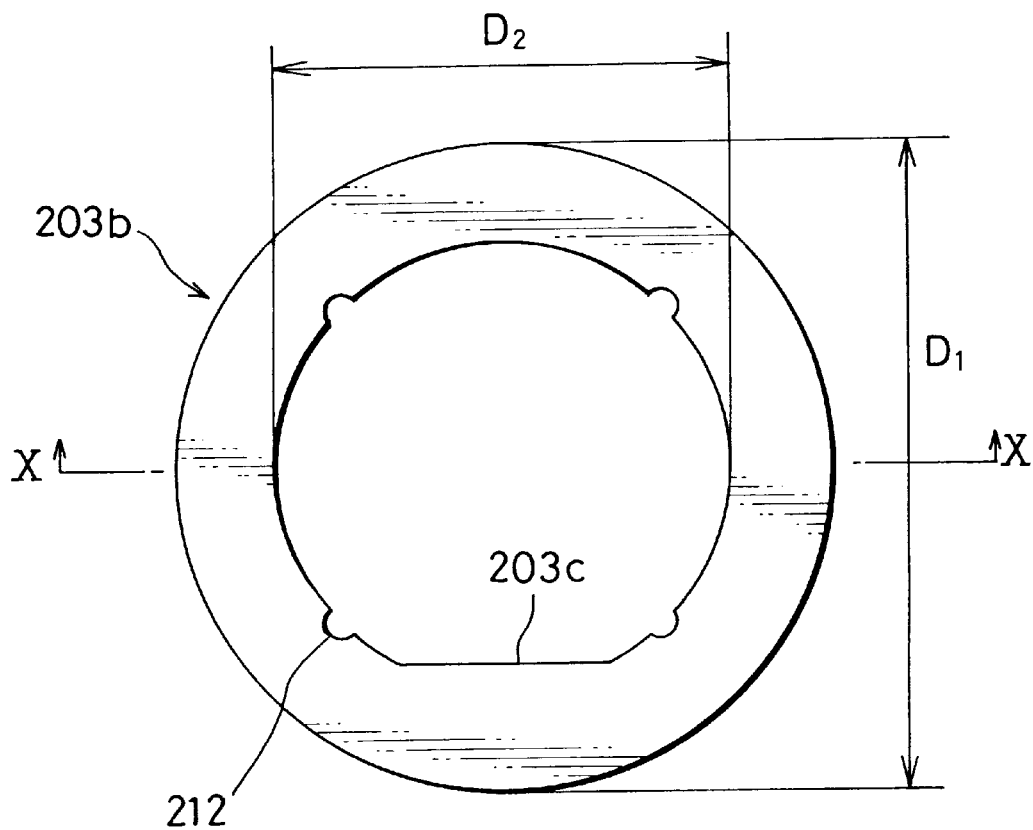
FIG. 9 is a plan view of an inner part of a susceptor used for a vapor-phase growth system according to a second embodiment of the invention.
Figure 10:
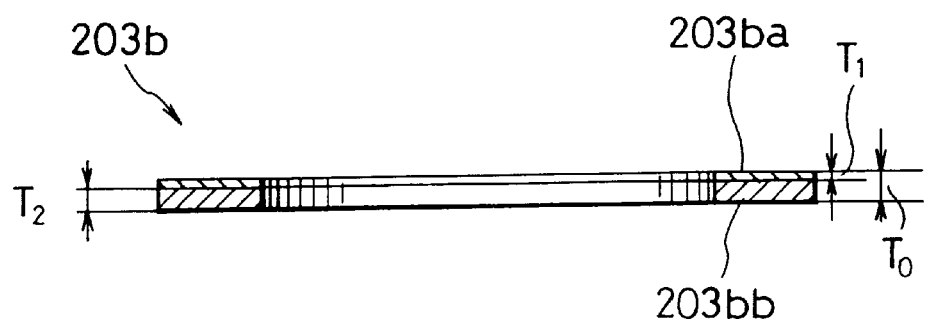
FIG. 10 is a schematic cross-section of the inner part of the susceptor along the line X—X in FIG. 9.

FIGS. 9 and 10 show an inner part of a susceptor used for a vapor-phase growth system according to a second embodiment of the invention. The system according to the second embodiment is the same in configuration as that of first embodiment other than the inner part of the susceptor. Therefore, no explanation relating to the same configuration is stated here for the sake of simplification of description.

The inner part 103b is made of a bulk single-crystal silicon in the first embodiment. However, the inner part 203b has a SOI structure, in other words, it is made of a SOI substrate. As shown in FIG. 10, the SOI substrate is composed of a lower quartz plate 203bb and an upper single-crystal silicon layer 203ba. A flat 203c and four semicircular holes 212 are formed on the inner side of the part 203b in the same manner as the first embodiment.

This SOI substrate is horizontally placed in the reactor 112 so that the quartz plate 203bb is exposed to the heater chamber 107 and the silicon layer 203ba is exposed to the growth chamber 102. The inner and outer diameters $D_1$ and $D_2$ are the same as those in the first embodiment. The thickness $T_1$ of the silicon layer 203ba is 10 am, the thickness $T_2$ of the quartz plate 203bb is 4 mm, and the total thickness $T_0$ of the part 203b is 4.01 mm.

The SOI substrate is usually produced by bonding a single-crystal silicon layer to a quartz plate, and then, the silicon layer thus bonded is chemically and mechanically polished up to a specified thickness.

Figure 11:
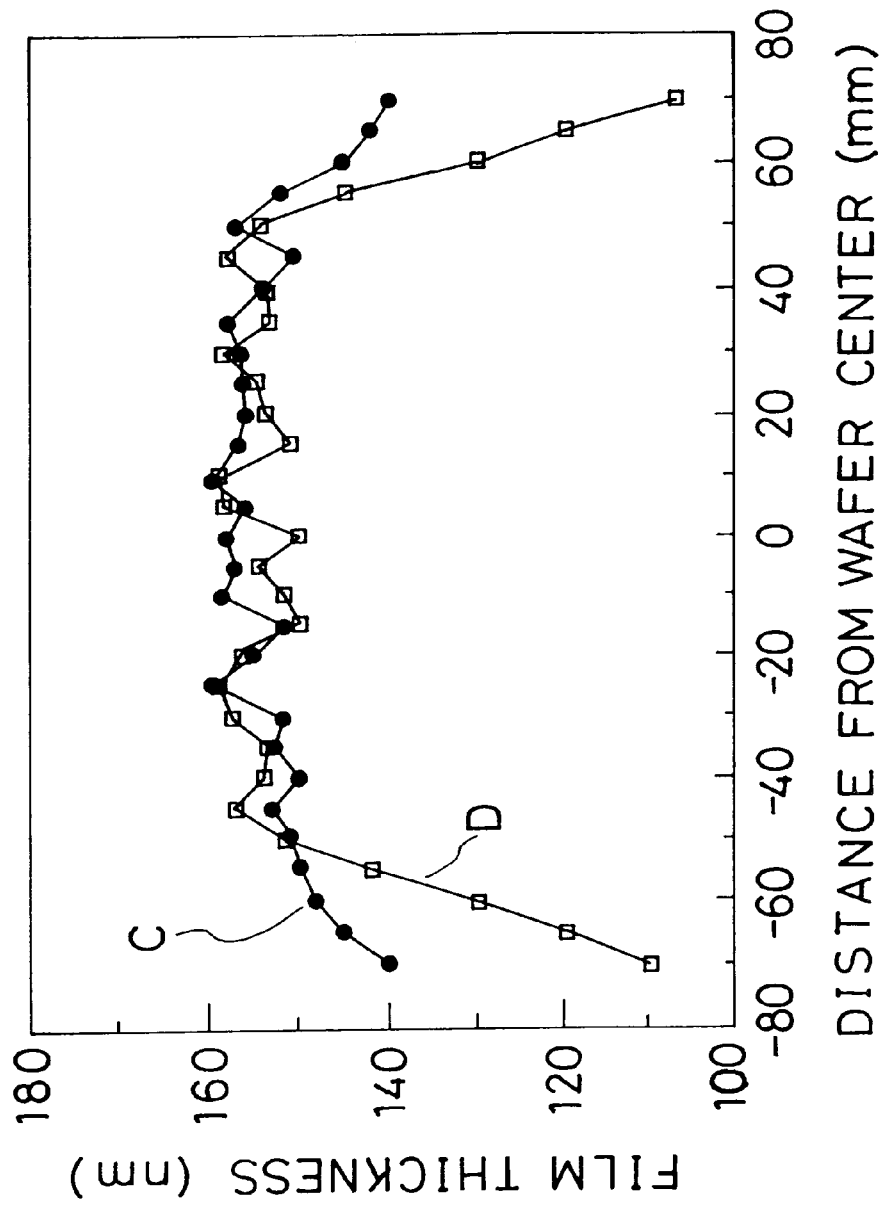
FIG. 11 is a graph showing a relationship between the distance from the wafer center and the film thickness in the vapor-phase growth system of FIG. 9.

FIG. 11 shows the thickness fluctuation or distribution of the single-crystal silicon film, which was obtained in the same growth conditions as those in the first embodiment. The plot C shows the result of the second embodiment and the plot D shows that of the first embodiment.

It is seen from FIG. 11 that the thickness tends to decrease drastically in the peripheral area of the wafer in the first embodiment, and that the thickness decrease is improved in the second embodiment.

Further, similar to the first embodiment, no film thickness fluctuation was observed even when the growth process was repeated 1000 times in the second embodiment. The reason was that the single-crystal layer 203ba of the inner part 203b is exposed to the growth chamber 102, and as a result, no separation of the deposited polysilicon film takes place.

In the first embodiment, the inner part 103b of the susceptor 103 is made of a thick single-crystal silicon plate (T=4 mm). The peripheral area of the wafer 101 is heated by the heater unit 105 through the inner part 103b made of a thick silicon plate. Accordingly, the temperature of the wafer 101 tends to decrease in the peripheral area due to the high heat-absorption rate of silicon.

On the other hand, in the second embodiment, the peripheral area of the wafer 101 is mainly made of quartz which has a smaller heat absorption rate than silicon. As a result, the temperature decrease of the wafer in the peripheral area is smaller than the case of the first embodiment.

In the second embodiment, although the single-crystal silicon layer 203ba has a thickness of 10 $\mu$m, it is preferred that the thickness of the layer 203ba is as thin as possible while no exposure of the quartz from the silicon layer 203ba is maintained.

Third Embodiment

Figure 12:
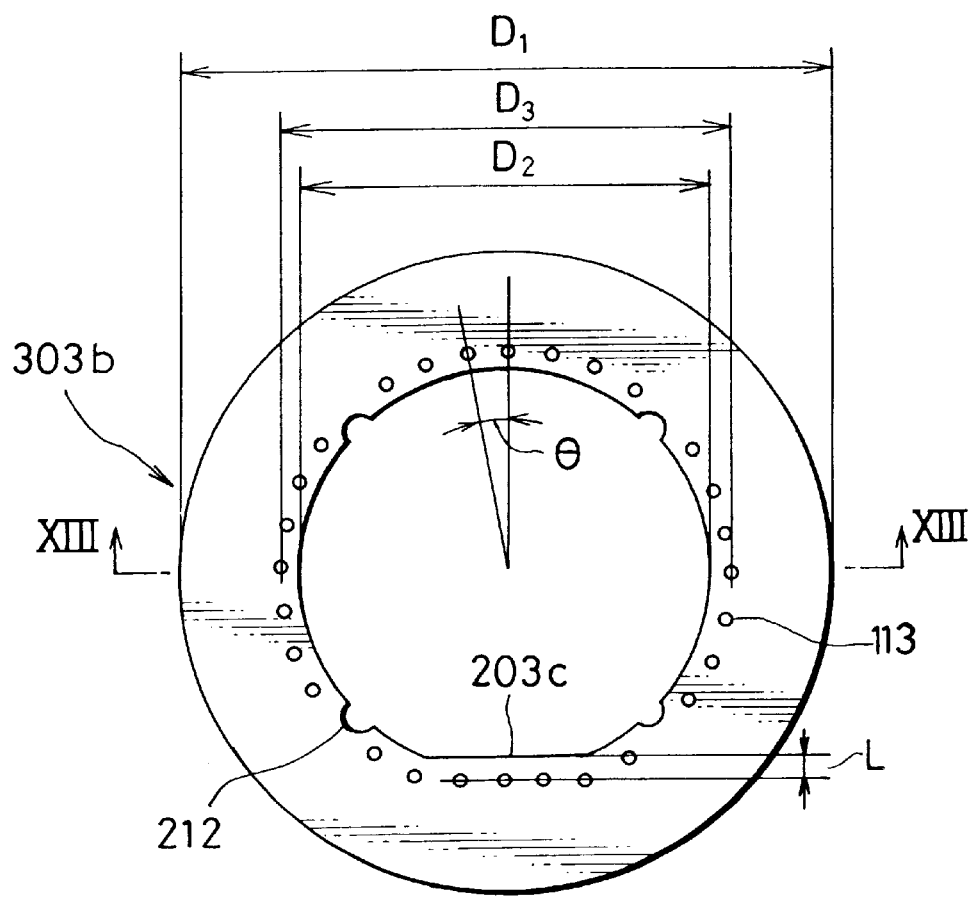
FIG. 12 is a plan view of an inner part of a susceptor used for a vapor-phase growth system according to a third embodiment of the invention.
Figure 13:
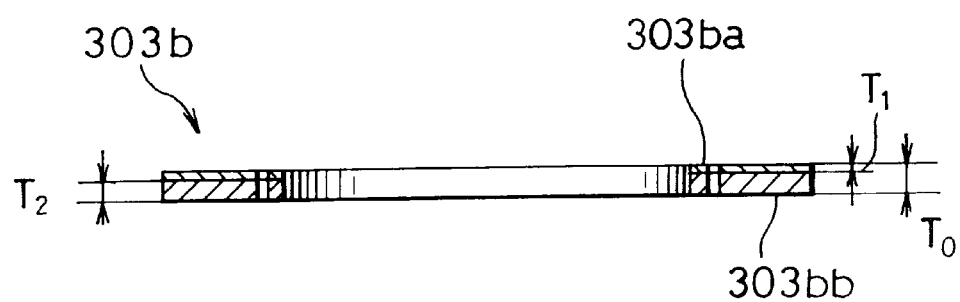
FIG. 13 is a schematic cross-section of the inner part of the susceptor along the line XIII—XIII in FIG. 12.

FIGS. 12 and 13 show an inner part of a susceptor used for a vapor-phase growth system according to a third embodiment of the invention. The system according to the third embodiment is the same in configuration as that of first embodiment other than the inner part of the susceptor. Therefore, no explanation relating to the same configuration is stated here for the sake of simplification of description.

The inner part 303*b* is the same in configuration as the inner part 203*b* of the second embodiment except that a plurality of penetrating holes 113 are formed around the inner edge. The outer diameter $D_1$ is 200 mm and the inner diameter $D_2$ is 130 mm. The holes 113, each having a diameter of 4 mm, are arranged at regular intervals on a circle whose diameter $D_3$ is 140 mm. The central angle $\Theta$ of the adjacent two holes 113 is 11.25°. The distance L between the holes 113 and the inner edge of the flat 203*c* is 5 mm.

FIG. 14 shows the thickness fluctuation distribution of the single-crystal silicon film, which was obtained in the same growth conditions as those in the third embodiment. The plot E shows the result of the third embodiment and the plot F shows that of the second embodiment.

The thickness tends to decrease drastically in the peripheral area of the wafer in the first embodiment. With reference to FIG. 14, thickness decrease is improved in the third embodiment compared with the second embodiment.

Further, similar to the first embodiment, no film thickness fluctuation was observed even when the growth process was repeated 1000 times in the second embodiment. The reason was that the single-crystal layer 303*ba* of the inner part 303*b* is exposed to the growth chamber 102, and as a result, no separation of the deposited polysilicon film takes place.

In the third embodiment, the peripheral area of the wafer 101 is mainly made of quartz having a smaller heat absorption rate than silicon. As a result, the temperature decrease of the wafer in the peripheral area is smaller than the case of the first embodiment.

The system according to the third embodiment has the following advantage that this embodiment is preferred for a large-sized wafer. A large-sized wafer tends to bend due to its weight, this bending accelerates the slip defects caused by a thermal shock.

To reduce the bending of the wafer 101, it is preferable that the inner diameter of the susceptor 103 is reduced. However, the area where the temperature decreases is increased. With the third embodiment, the contact area and the susceptor itself can be reduced.

In the above first to third embodiments, the wafer has a diameter $D_W$ is 150 mm. However, the invention may have any other diameters such as 200 mm or 300 nm. Also, although the susceptor is made of the outer and inner parts, it may be made of the inner part alone.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A vapor-phase growth system comprising:
   a reactor having an inner space;
   a substrate holder with a supporting portion for contacting and supporting a substrate;
   a heater for heating said substrate;
   said substrate holder and said heater placed in said inner space of said reactor; and
   said substrate holder and said substrate supported thereby dividing said inner space of said reactor into (1) a growth chamber in which a thin film is grown during a growth process on said substrate and (2) a heater chamber in which said heater is placed;
   wherein said supporting portion of said substrate holder and said film are made of a material selected from the group consisting of single-crystal and polycrystalline silicon.

2. The system as claimed in claim 1, wherein a remainder part of said substrate holder, not including said supporting portion, is made of another material having a lower heat absorption rate than that of said material selected from the group consisting of single crystal and polycrystalline silicon.

3. The system as claimed in claim 1, wherein said substrate holder further includes:
   a supporting member made of a Silicon-On-Insulator substrate, said supporting member having said supporting portion.

4. The system as claimed in claim 3, wherein said Silicon-on-Insulator substrate further includes:
   a quartz plate; and
   a single-crystal silicon layer bonded onto said quartz plate.

5. The system as claimed in claim 1, further comprising uniformly sized penetrating holes formed at regular intervals in said supporting portion of said supporting member.

6. The system as claimed in claim 1, wherein said substrate holder further includes:
   a supporting member with an inner part having a window and an outer part engaged with said inner part;
   wherein a surface of said substrate is exposed to said growth chamber and another surface thereof is exposed to said heater chamber through said window.

7. The system as claimed in claim 6, wherein (1) said inner part is (i) made of said material selected from the group consisting of single-crystal and polycrystalline silicon, and (ii) includes said supporting portion, and (2) said outer part is made of another material having a lower heat absorption rate than that of said material selected from the group consisting of single-crystal and polycrystalline silicon.

8. A system as claimed in claim 1, wherein said supporting portion of said supporting member has a same crystallinity as said thin film grown on said substrate.

9. A system as claimed in claim 1, wherein said thin film is grown on a first main surface of said substrate; and
   wherein said supporting portion of said supporting member is contacted with a second main surface of said substrate opposite to said first main surface.

10. A vapor-phase growth system comprising:
    a reactor having an inner space;
    a substrate holder with a supporting portion for contacting and supporting a substrate;
    a heater for heating said substrate;
    said substrate holder and said heater placed in said inner space of said reactor; and
    said substrate holder and said substrate supported thereby dividing said inner space of said reactor into (1) a growth chamber in which a thin film is grown during a growth process on said substrate and (2) a heater chamber in which said heater is placed;
    wherein said supporting portion of said substrate holder and said film are made of a first material, said substrate holder has a through hole for allowing heat energy to radiate from said heater to said substrate; and said first material is one of single-crystal and polycrystalline silicon.

11. The system as claimed in claim 10, wherein a remainder part of said substrate holder, not including said supporting portion, is made of a second material having a lower heat absorption rate than that of said first material.

12. The system as claimed in claim 10, wherein said substrate holder further includes:

a supporting member made of a Silicon-On-Insulator substrate, said supporting member having said supporting portion.

13. The system as claimed in claim 12, wherein said Silicon-on-Insulator substrate further includes:

a quartz plate; and a single-crystal silicon layer bonded onto said quartz plate.

14. The system as claimed in claim 10, further comprising uniformly sized penetrating holes formed at regular intervals in said supporting portion of said supporting member.

* * * * *